United States Patent
Lin et al.

(10) Patent No.: US 6,211,031 B1
(45) Date of Patent: Apr. 3, 2001

(54) METHOD TO PRODUCE DUAL POLYSILICON RESISTANCE IN AN INTEGRATED CIRCUIT

(75) Inventors: Dah-Chih Lin; Chin-Heng Shen, both of Hsin-Chu; Sen-Fu Chen, Taipei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/165,000

(22) Filed: Oct. 1, 1998

(51) Int. Cl.$^7$ ................................................ H01L 21/20
(52) U.S. Cl. ............................................................ 438/384
(58) Field of Search ..................................... 438/384, 385, 438/386–399, 382, 45, 210, 283, 532; 430/313, 316, 314; 257/380

(56) References Cited

U.S. PATENT DOCUMENTS

| | | | |
|---|---|---|---|
| 4,643,777 | 2/1987 | Maeda | 148/1.5 |
| 5,474,948 | 12/1995 | Yamazaki | 437/60 |
| 5,514,617 | 5/1996 | Liu | 437/60 |
| 5,554,554 | 9/1996 | Bastani et al. | 437/47 |
| 5,554,873 | 9/1996 | Erdeljac et al. | 257/380 |
| 5,622,884 | 4/1997 | Liu | 438/238 |
| 5,705,418 | 1/1998 | Liu | 437/46 |
| 6,143,474 | * 11/2000 | Shen et al. | 430/313 |

* cited by examiner

Primary Examiner—Chandra Chaudhari
Assistant Examiner—Craig Thompson
(74) Attorney, Agent, or Firm—George O. Saile; Stephen B. Ackerman; Rosemary L. S. Pike

(57) ABSTRACT

A new method of forming polysilicon resistors having differing resistances using a dual polysilicon process is described. A first polysilicon layer is deposited over a dielectric layer on a semiconductor substrate. The first polysilicon layer is etched away where it is not covered by a mask. Thereafter, a second polysilicon layer is deposited overlying the first polysilicon layer and the dielectric layer. The first and second polysilicon layers are patterned to form a first polysilicon structure comprising the first and second polysilicon layers over the dielectric layer and a second polysilicon structure comprising the second polysilicon layer overlying the dielectric layer. The first and second polysilicon structures are doped to form the first polysilicon structure having a first resistance and the second polysilicon structure having a second resistance wherein the first resistance is lower than the second resistance.

22 Claims, 3 Drawing Sheets

METHOD TO PRODUCE DUAL POLYSILICON RESISTANCE IN AN INTEGRATED CIRCUIT

BACKGROUND OF THE INVENTION (1) Field of the Invention

The invention relates to a method of forming gates, resistors, and capacitors in the fabrication of integrated circuits, and more particularly, to a method of forming gates, resistors, and capacitors having different polysilicon resistances in the manufacture of integrated circuits.

(2) Description of the Prior Art

In order to form different polysilicon resistances for the gate, resistor, and capacitor plate in an integrated circuit, the area and length of the polysilicon must be modified to meet the different criteria. This is a complex process that will increase the cost of manufacturing. Related process issues such as lateral diffusion are also a concern.

Co-pending U.S. patent application Ser. No. 09/073,948 (TSMC-97-515) to Chen et al, filed on May 7, 1998, teaches patterning a polysilicon layer to form different thicknesses of polysilicon and then doping the polysilicon to form resistors having different resistances. Co-pending U.S. patent application Ser. No. 09/073,950 (TSMC-97-508) to Shen et al, filed on May 7, 1998, teaches forming different thicknesses of an oxide layer over a polysilicon layer and then doping the polysilicon through the different oxide thicknesses to form resistors having different resistances. U.S. Pat. No. 5,554,554 to Bastani et al teaches forming high and low resistance poly loads by a selective ion implantation process. U.S. Pat. No. 5,705,418 to Liu shows a method of forming high-resistance load resistors by using a LOCOS process to reduce the thickness of portions of a polysilicon layer. U.S. Pat. No. 5,514,617 to Liu and U.S. Pat. No. 5,554,873 to Erdeljac et al teach selective a doping to form variable resistance polysilicon. U.S. Pat. No. 4,643,777 to Maeda shows selective ion implantation to form low resistance polysilicon regions. U.S. Pat. No. 5,662,884 to Liu discloses a high resistance poly load resistor. U.S. Pat. No. 5,474,948 to Yamazaki discloses a poly load resistor.

SUMMARY OF THE INVENTION

Accordingly, it is a principal object of the present invention to provide an effective and very manufacturable method of forming a gate, resistor, and capacitor plate having differing polysilicon resistances.

A further object of the invention is to provide a method for forming polysilicon resistors having differing resistances.

A still further object is to provide a method for forming polysilicon resistors having differing resistances using a dual polysilicon process.

Another object of the invention is to control polysilicon resistance using different polysilicon thicknesses.

Yet another object is to provide a method for producing different polysilicon resistances using one-time doping.

Yet another object of the invention is to provide a method for eliminating lateral diffusion of dopant by doping after patterning the polysilicon.

In accordance with the objects of this invention a new method of forming polysilicon resistors having differing resistances using a dual polysilicon process is achieved. A first polysilicon layer is deposited over a dielectric layer on a semiconductor substrate. The first polysilicon layer is etched away where it is not covered by a mask. Thereafter, a second polysilicon layer is deposited overlying the first polysilicon layer and the dielectric layer. The first and second polysilicon layers are patterned to form a first polysilicon structure comprising the first and second polysilicon layers over the dielectric layer and a second polysilicon structure comprising the second polysilicon layer overlying the dielectric layer. The first and second polysilicon structures are doped to form the first polysilicon structure having a first resistance and the second polysilicon structure having a second resistance wherein the first resistance is lower than the second resistance.

BRIEF DESCRIPTION OF THE DRAWINGS

In the accompanying drawings forming a material part of this description, there is shown.

DESCRIPTION OF THE PREFERRED EMBODIMENTS

In the fabrication of an integrated circuit device such as a dynamic random access memory (DRAM) device, for example, gate electrodes, polysilicon resistors, and capacitor plates all comprise polysilicon, but require different resistances, depending on their function. For example, a low resistance may be between about 20 and 200 ohms and a high resistance may be between about 200 and 10,000 ohms. The process of the present invention provides a simple and effective method for forming polysilicon resistors having differing resistances.

Figure 1:
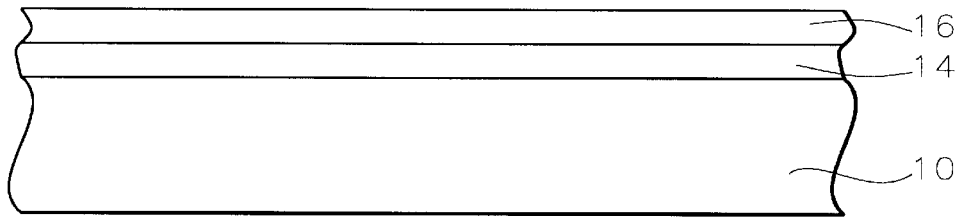
FIGS. 1 through 6 schematically illustrate in cross-sectional representation a preferred embodiment of the present invention.

Referring now more particularly to FIG. 1, there is illustrated a portion of a partially completed integrated circuit. There is shown a semiconductor substrate 10, preferably composed of monocrystalline silicon.

A dielectric layer 14 is grown or deposited over the surface of the semiconductor substrate. This may be a silicon dioxide layer having a thickness of between about 50 and 6000 Angstroms. This layer may be a gate oxide layer for a gate electrode or a field oxide layer for a resistor. A capacitor plate may be formed over either a gate oxide layer or a field oxide layer.

A first layer of polysilicon 16 is deposited over the dielectric layer 14 to a thickness of between about 1000 and 2000 Angstroms. This layer be may in situ doped or undoped.

Figure 2:
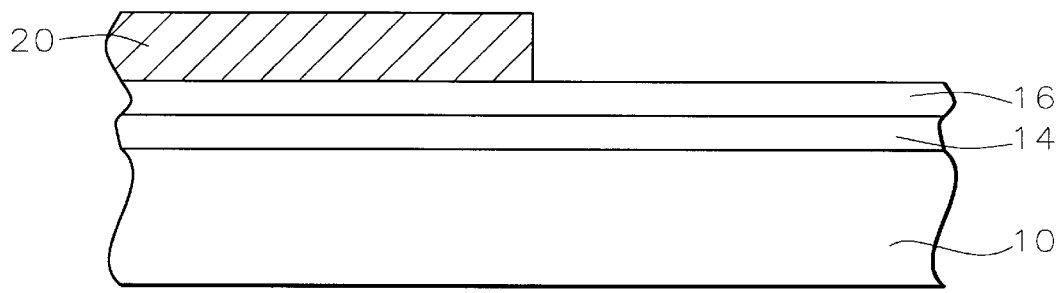

A photoresist layer is coated over the surface of the first polysilicon layer 14 and patterned to form the photoresist mask 20, as illustrated in FIG. 2, where the areas that are to be of high resistance are exposed by the photoresist mask.

Figure 3:
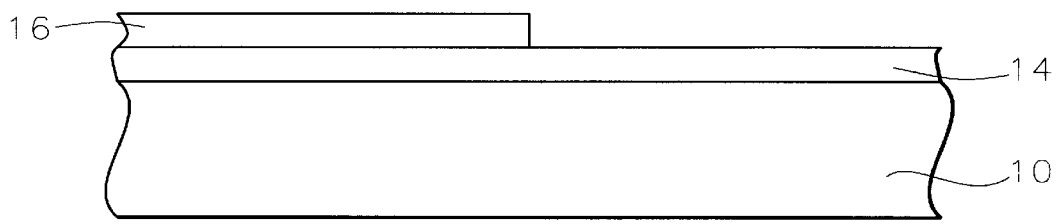

Referring now to FIG. 3, the polysilicon layer 16 is etched away where it is exposed by the photoresist mask. The photoresist mask is removed. If the polysilicon layer is undoped, it may now be doped by ion implantation.

Figure 4:
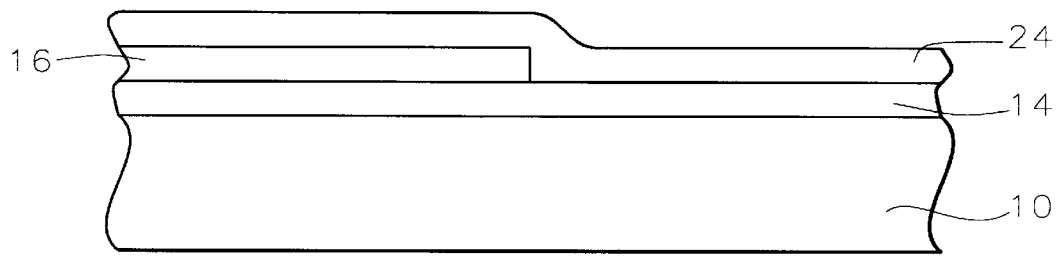

Now, a second layer of polysilicon 24 is deposited over the dielectric layer 14 and the patterned polysilicon layer 16 to a thickness of between about 1000 and 2000 Angstroms, as shown in FIG. 4. This layer be may in situ doped or undoped.

Figure 5:
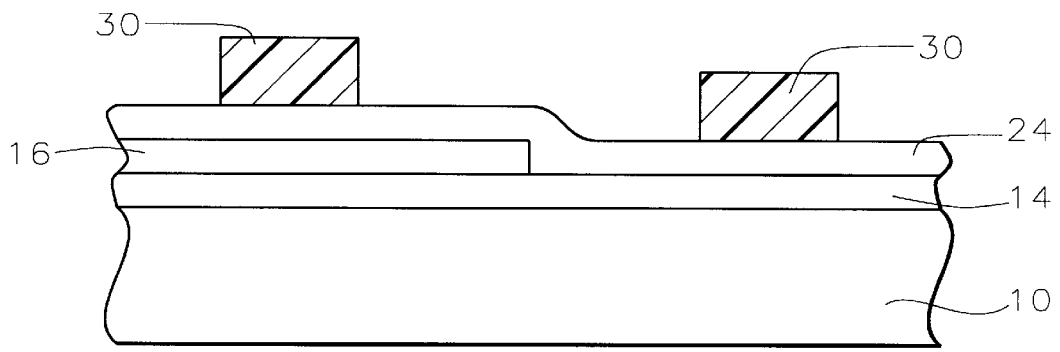

Referring now to FIG. 5, a photoresist layer is coated over the surface of the second polysilicon layer 24 and patterned to form a photoresist mask 30.

Figure 6:
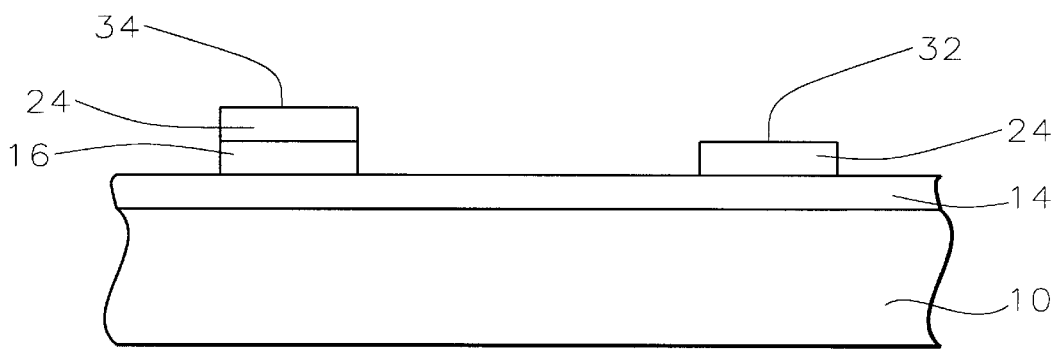

The polysilicon layers 24 and 16 are etched away where they are not covered by the photoresist mask 30 to form the polysilicon resistors 32 and 34, shown in FIG. 6. The photoresist mask 30 is removed. If the polysilicon layers 24 and 16 have not been doped in-situ, they are now doped. In-situ doping is preferred to save costs and to prevent lateral diffusion. Doping after patterning the polysilicon is the best way to prevent lateral diffusion.

Resistor 32 is a high resistance resistor having a thickness of between about 1000 and 2000 Angstroms and a resistance of between about 200 and 10,000 ohms. Resistor 34 is a low resistance resistor having a thickness of between about 2000 and 4000 Angstroms and a resistance of between about 20 and 200 ohms.

The process of the present invention provides a simple and effective method of producing dual polysilicon resistance in an integrated circuit device. Polysilicon resistance is controlled by using different polysilicon thicknesses. Different polysilicon resistances are produced using a one time doping. Doping after polysilicon patterning eliminates lateral diffusion.

Figure 7:
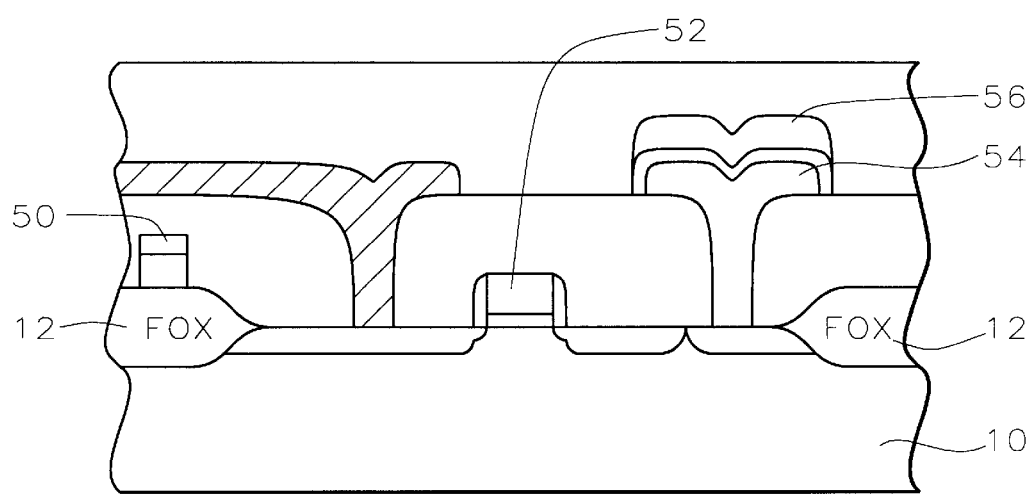
FIG. 7 schematically illustrates in cross-sectional representation a completed DRAM device fabricated by the process of the present invention.

For example, the process of the present invention can be used in the manufacture of a dynamic random access memory (DRAM) device such as that illustrated in FIG. 7. Gate electrode 52, resistor 50, and capacitor 56 are illustrated. In this example, resistor 50 comprises two layers of polysilicon and so has a low resistance. Gate electrode 52 and bottom capacitor plate 54 have a single layer of polysilicon and hence have a high resistance. It should be understood that FIG. 7 is an example only. Any of the resistors 50, gate electrodes 52, and capacitors 56 may have high or low resistances, depending on the design of the integrated circuit device. The important point is that the resistance can be controlled by using different polysilicon thicknesses. A thicker polysilicon results in a low resistance and a thinner polysilicon results in a high resistance.

While the invention has been particularly shown and described with reference to the preferred embodiments thereof, it will be understood by those skilled in the art that various changes in form and details may be made without departing from the spirit and scope of the invention.

What is claimed is:

1. A method of forming a plurality of polysilicon structures having different resistance values comprising:
    providing a dielectric layer overlying a semiconductor substrate;
    depositing a first polysilicon layer overlying said dielectric layer;
    etching away said first polysilicon layer where it is not covered by a mask;
    thereafter depositing a second polysilicon layer overlying said first polysilicon layer and said dielectric layer;
    patterning said first and second polysilicon layers to form a first polysilicon structure comprising said first and second polysilicon layers over said dielectric layer and a second polysilicon structure comprising said second polysilicon layer overlying said dielectric layer; and
    doping said first and second polysilicon structures to form said first polysilicon structure having a first resistance and said second polysilicon structure having a second resistance wherein said first resistance is lower than said second resistance.

2. The method according to claim 1 wherein said first dielectric layer comprises silicon dioxide and has a thickness of between about 50 and 6000 Angstroms.

3. The method according to claim 1 wherein said first polysilicon layer has a thickness of between about 1000 and 2000 Angstroms.

4. The method according to claim 1 wherein said second polysilicon layer has a thickness of between about 1000 and 2000 Angstroms.

5. The method according to claim 1 wherein said first resistance is between about 20 and 200 ohms.

6. The method according to claim 1 wherein said second resistance is between about 200 and 10,000 ohms.

7. The method according to claim 1 wherein said plurality of polysilicon structures comprise one or more of the group containing gate electrodes, resistors, and capacitor bottom plates.

8. The method according to claim 1 wherein said second polysilicon structure is one of the group containing a gate electrode, a resistor, and a capacitor bottom plate.

9. A method of forming a plurality of polysilicon structures having different resistance values comprising:
    providing a dielectric layer overlying a semiconductor substrate;
    depositing a first polysilicon layer overlying said dielectric layer;
    etching away said first polysilicon layer where it is not covered by a mask;
    thereafter depositing a second polysilicon layer overlying said first polysilicon layer and said dielectric layer; and
    patterning said first and second polysilicon layers to form a first polysilicon structure comprising said first and second polysilicon layers over said dielectric layer and a second polysilicon structure comprising said second polysilicon layer overlying said dielectric layer wherein said first polysilicon structure has a first resistance and said second polysilicon structure has a second resistance wherein said first resistance is lower than said second resistance to complete said formation of said plurality of polysilicon structures having different resistance values.

10. The method according to claim 9 wherein said first dielectric layer comprises silicon dioxide and has a thickness of between about 50 and 6000 Angstroms.

11. The method according to claim 9 wherein said first polysilicon layer has a thickness of between about 1000 and 2000 Angstroms.

12. The method according to claim 9 wherein said second polysilicon layer has a thickness of between about 1000 and 2000 Angstroms.

13. The method according to claim 9 wherein said first polysilicon layer is in-situ doped.

14. The method according to claim 9 wherein said second polysilicon layer is in-situ doped.

15. The method according to claim 9 wherein said first polysilicon layer is doped after said step of etching away said first polysilicon layer where it is not covered by said mask.

16. The method according to claim 9 wherein said first and second polysilicon structures are doped after said step of patterning said first and second polysilicon layers.

17. The method according to claim 9 wherein said first resistance is between about 20 and 200 ohms.

18. The method according to claim 9 wherein said second resistance is between about 200 and 10,000 ohms.

19. A method of forming a plurality of polysilicon structures having different resistance values comprising:
    providing a dielectric layer overlying a semiconductor substrate;

depositing a first polysilicon layer overlying said dielectric layer wherein said first polysilicon layer is in situ doped;

etching away said first polysilicon layer where it is not covered by a mask;

thereafter depositing a second polysilicon layer overlying said first polysilicon layer and said dielectric layer wherein said second polysilicon layer is in situ doped; and patterning said first and second polysilicon layers to form a first polysilicon structure comprising said first and second polysilicon layers over said dielectric layer and a second polysilicon structure comprising said second polysilicon layer overlying said dielectric layer wherein said first polysilicon structure has a first resistance and said second polysilicon structure has a second resistance wherein said first resistance is lower than said second resistance to complete said formation of said plurality of polysilicon structures having different resistance values.

20. The method according to claim 19 wherein said first and second polysilicon layers each have a thickness of between about 1000 and 2000 Angstroms.

21. The method according to claim 19 wherein said first resistance is between about 20 and 200 ohms.

22. The method according to claim 19 wherein said second resistance is between about 200 and 10,000 ohms.

* * * * *